(12) United States Patent
Liu et al.

(10) Patent No.: US 7,091,600 B2
(45) Date of Patent: Aug. 15, 2006

(54) PREVENTION OF POST CMP DEFECTS IN CU/FSG PROCESS

(75) Inventors: Chung-Shi Liu, Hsin-Chu (TW); Shau-Lin Shue, Hsinchu (TW)

(73) Assignee: Taiwan Semiconductor Manufacturing Company Ltd., Hsin-Chu (TW)

( * ) Notice: Subject to any disclaimer, the term of this patent is extended or adjusted under 35 U.S.C. 154(b) by 15 days.

(21) Appl. No.: 10/791,014

(22) Filed: Mar. 2, 2004

(65) Prior Publication Data

US 2004/0171248 A1    Sep. 2, 2004

Related U.S. Application Data

(62) Division of application No. 09/863,223, filed on May 24, 2001, now Pat. No. 6,723,639.

(51) Int. Cl.
*H01L 23/48* (2006.01)
(52) U.S. Cl. ...................... 257/698; 257/700
(58) Field of Classification Search ................ 257/774, 257/698, 700
See application file for complete search history.

(56) References Cited

U.S. PATENT DOCUMENTS

| | | | |
|---|---|---|---|
| 6,008,120 A | 12/1999 | Lee | 438/634 |
| 6,103,601 A | 8/2000 | Lee et al. | 438/513 |
| 6,121,164 A | 9/2000 | Yieh et al. | 438/790 |
| 6,130,157 A | 10/2000 | Liu et al. | 438/669 |
| 6,136,680 A | 10/2000 | Lai et al. | 438/597 |
| 6,150,272 A | 11/2000 | Liu et al. | 438/692 |
| 6,319,814 B1 * | 11/2001 | Tsai et al. | 438/624 |

* cited by examiner

*Primary Examiner*—Fetsum Abraham
(74) *Attorney, Agent, or Firm*—Haynes and Boone, LLP

(57) ABSTRACT

A common problem associated with damascene structures made of copper inlaid in FSG (fluorinated silicate glass) is the formation of defects near the top surface of the structure. The present invention avoids this problem by laying down a layer of USG (undoped silicate glass) over the surface of the FSG layer prior to patterning and etching the latter to form the via hole and (for a dual damascene structure) the trench. After over-filling with copper, the structure is planarized using CMP. The USG layer acts both to prevent any fluorine from the FSG layer from reaching the copper and as an end-point detector during CMP. In this way defects that result from copper-fluorine interaction do not form and precise planarization is achieved.

10 Claims, 4 Drawing Sheets

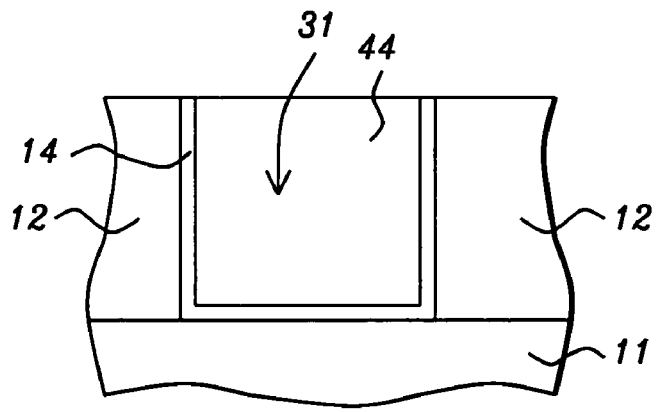
FIG. 1a – Prior Art
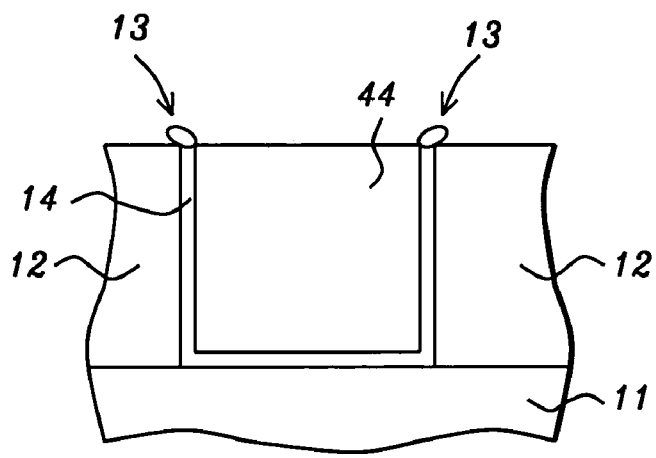
FIG. 1b – Prior Art
FIG. 2

PREVENTION OF POST CMP DEFECTS IN CU/FSG PROCESS

This is a division of patent application Ser. No. 09/863,223, filing date May 24, 2001, now U.S. Pat. No. 6,732,639, Prevention Of Post Cmp Defects In CU/FSG Process assigned to the same assignee as the present invention, which is herein incorporated by reference in its entirety.

FIELD OF THE INVENTION

The invention relates to the general field of semiconductor device manufacture with particular reference to etching via holes and wiring channels in fluorine-bearing dielectrics, followed by chem.-mech. polishing.

BACKGROUND OF THE INVENTION

As integrated circuits grow ever smaller and faster, delays associated with the wiring, as opposed to the active devices, have become increasingly more important. To reduce said delays it is necessary to reduce the resistance of the wires and/or the capacitance per unit length across the inter-metal dielectrics. Wire widths in integrated circuits have, however, continued to shrink so the electrical conductivity of the wiring material itself has become increasingly more important. Thus, aluminum, which has been the metal of choice since the integrated circuit art began, is now being increasingly replaced by copper.

Similarly, silicon dioxide, which has been the inter-metal dielectric (IMD) of choice since the integrated circuit art began, is now being increasingly replaced by new, low dielectric constant materials. An example of the latter is fluorinated silicon glass (FSG) which typically has a dielectric constant of about 3.5.

As might be expected, integrated circuits having both copper wiring and IMDs of FSG are now in active development at many locations. Before copper could be introduced into integrated circuits, one problem needed to be overcome, namely copper's tendency to be both a fast diffuser as well as a source of recombination centers in silicon. Although a number of materials were known to be effective barriers against copper diffusion at or near room temperature, they could not be relied upon when conventional multi-layering was used because of the difficulty of adequately covering the wiring's edges.

The wiring coverage problem was solved by the introduction of damascene wiring. The term damascene when used in connection with integrated circuit wiring, refers to the fact that a layer has been inlaid within a supporting medium, as opposed to being covered by it. Thus, instead of the wiring being laid down on top of the IMD, a trench is first formed in its surface and this trench then filled with copper. Lining the walls of the trench with a barrier layer prior to filling in with copper then becomes a straightforward procedure.

FIG. 1a is a schematic illustration of a damascene connector. Seen there is an FSG layer 12 on a substrate 11. Via hole 31 was etched through the full thickness of layer 12 so as to expose substrate 11 which, in most cases, would be the upper surface of a partially formed integrated circuit, and then just filled with copper material 44 (after laying down barrier layer 14). The filling step is accomplished by initially over-filling with copper and then removing the excess by means of chemical mechanical polishing (CMP).

Unfortunately, the fluoride ions in the FSG are not very strongly bound and a certain amount of free fluorine is able to react with the copper during the CMP process, resulting in the formation of defect structures 13 at the edges of the filled via hole, as illustrated schematically in FIG. 1b.

The present invention describes a structure, and process for making it, which overcomes this problem while still supporting copper damascene wiring on a FSG base.

A routine search of the prior art was performed with the following references of interest being found:

U.S. Pat. No. 6,008,120 (Lee) teaches use of the oxynitride ARC layer as the means for keeping fluoride away from the metal used to fill a via. Although there is an oxide cap over the oxynitride layer early in their process, they go to some trouble to selectively remove it from over the site of the future via hole. In U.S. Pat. No. 6,103,601, Lee et al. show how FSG films can be densified by hydrogen ion bombardment. The problem of etching a via hole through the FSG layer, filling it with copper and then planarizing by CMP is not discussed.

In U.S. Pat. No. 6,121,164, Yieh et al. are concerned with reducing stress in FSG layers. One approach they suggest is an overlying USG capping layer. Cu CMP is not part of their process. U.S. Pat. No. 6,130,157 (Liu et al.), and U.S. Pat. No. 6,136,680 (Lai et al.) show related patents while U.S. Pat. No. 6,150,272 (Liu et al.) show Cu CMP with FSG, using an organic layer over the FSG layer.

SUMMARY OF THE INVENTION

It has been an object of the present invention to provide single and dual damascene structures of copper and FSG.

Another object has been that said structures be free of defects near the copper-FSG interface that arise from an interaction between fluorine and copper.

A further object has been to provide a process for manufacturing the structures.

These objects have been achieved by laying down a layer of USG over the surface of the FSG layer prior to patterning and etching the latter to form the via hole and (for a dual damascene structure) the trench. After over-filling with copper, the structure is planarized using CMP. The USG layer acts both to prevent any fluorine from the FSG layer from reaching the copper and as an end-point detector during CMP. In this way defects that result from copper-fluorine interaction do not form.

BRIEF DESCRIPTION OF THE DRAWINGS

FIG. 1a illustrates a typical single damascene structure of the prior art.

FIG. 1b shows how defects can form near the edges of the copper filler for structures processed according to the teachings of the prior art.

FIGS. 2–5 show the manufacturing process and resulting structure of a single damascene connector made according to the teachings of the present invention.

DESCRIPTION OF THE PREFERRED EMBODIMENTS

The present invention is applicable to both single and dual damascene structures. FIGS. 1a and 1b are examples of the former. Referring now to FIG. 2, the starting point of the process of the present invention is the provision of FSG layer 12 on substrate 11. This layer is deposited to a thickness between about 2,000 and 10,000 Angstroms and contains between about 3 and 10 atomic % fluorine. Substrate 11 is usually (though not necessarily) a partially formed integrated circuit. The part that is inside the via hole could be a contact area on an active device or it could be wiring at the next level down.

Figure 3:
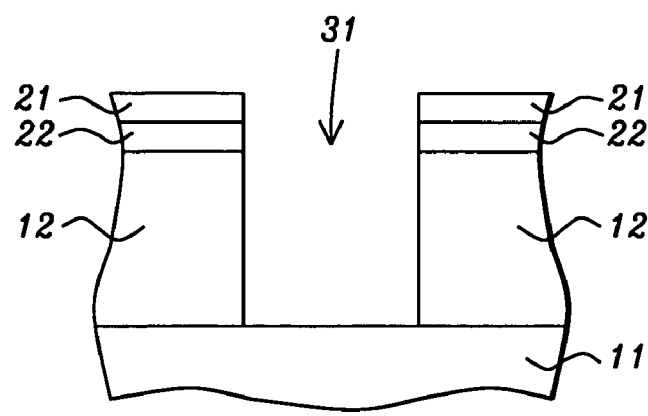

Then, as a key feature of the present invention, layer 22 of undoped silicate glass (USG) is deposited onto the upper surface of FSG layer 12. This layer is deposited to a thickness between about 0.1 and 0.2 microns. Its deposition is achieved by means of PECVD (plasma enhanced chemical vapor deposition) from silane or TEOS (tetra-ethyl-ortho-silicate) at about 400° C. and it contains from 0 to about 2 atomic % fluorine. This is followed by the deposition of silicon oxynitride layer 21 which will serve as an anti-reflection coating (ARC). Then, using standard photolithographic processes, layers 21, 22, and 12 are patterned and then etched to form via hole 31 which extends as far layer 11. This is shown in FIG. 3.

Figure 4:
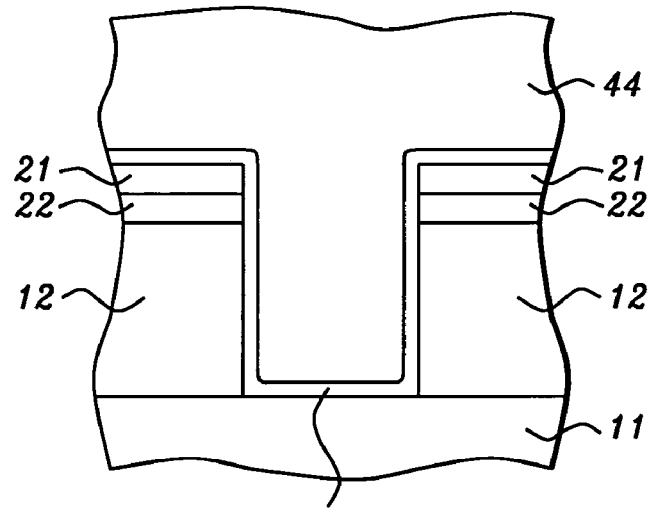

Referring now to FIG. 4, the next step is the deposition of barrier layer 14 on all walls of the via hole. This layer is between about 50 and 500 Angstroms thick and could be one of several possible materials such as tantalum, tantalum nitride, titanium nitride, and titanium silicon nitride. This is followed by the deposition of a copper seed layer (not shown) on barrier layer 14. Via hole 31 is then overfilled with copper 44, as shown.

Figure 5:
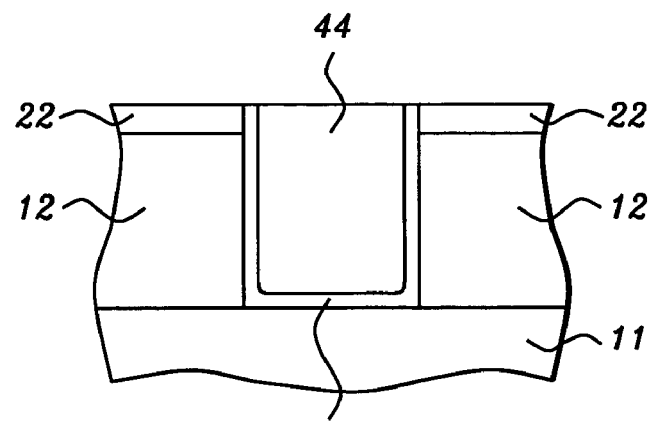

Then, as seen in FIG. 5, CMP is used to remove the excess copper with material removal continuing until USG layer 22 is reached. Note that, in addition to acting as a sink for fluoride ions coming out of the FSG layer, USG layer 22 is also being used as an optically based end-point detector for the CMP process.

Figure 6:
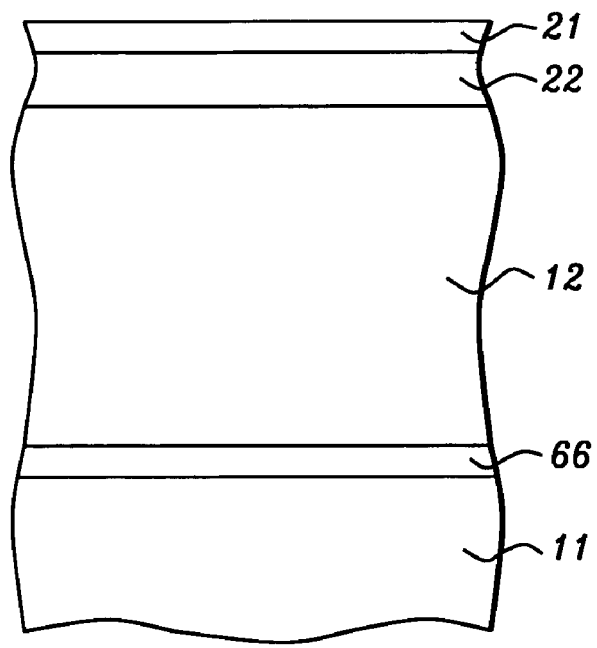
FIGS. 6–9 show the manufacturing process and resulting structure of a dual damascene connector made according to the teachings of the present invention.

The process of the present invention, as applied to a dual damascene structure, begins as schematically illustrated in FIG. 6. This is similar to FIG. 2 except that silicon nitride layer 66 has been deposited between substrate 11 and FSG layer 12. The thickness of this layer is between about 300 and 1,000 Angstroms. As for the single damascene case, USG layer 22 is deposited on the upper surface of FSG layer 12 followed by the deposition of silicon oxynitride layer 21, to a thickness between about 400 and 1,500 Angstroms, for use as an anti-reflection coating during photolithography.

Figure 7:
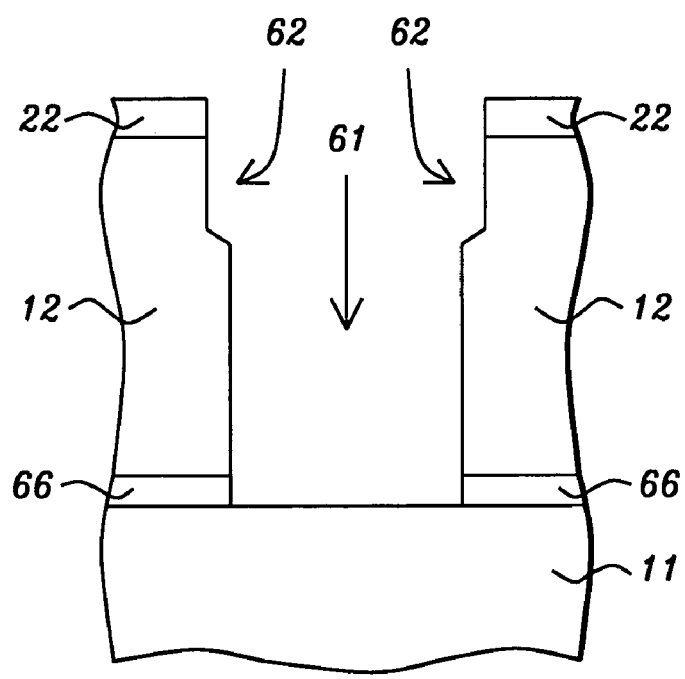

The next step comprises patterning and then fully etching layers 21, 22, and partly etching layer 12 to a depth of between about 0.2 and 2 microns, thereby forming trench 62 as shown in FIG. 7. Typically, the trench has a width between about 0.1 and 1 microns. A second patterning and etching step then follows during which layer 12 is further etched down to the etch stop silicon nitride layer 66, to form via hole 61 which typically has a width between about 0.1 and 0.6 microns and a depth between about 0.4 and 1 microns. Silicon nitride layer 66 is then selectively removed, during the course of which silicon oxynitride layer 21 also gets removed.

Figure 8:
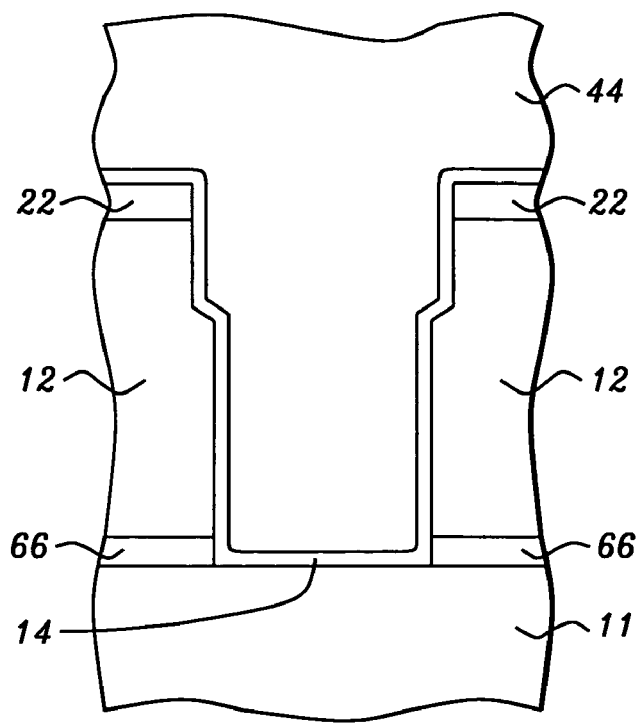

Referring now to FIG. 8, as was the case for the single damascene structure, barrier layer 14 is the deposition on all walls of the trench and the via hole. This is followed by the deposition of a copper seed layer (not shown) on barrier layer 14. Trench 62 and via hole 61 are then overfilled with copper 44, as shown in FIG. 8.

Figure 9:
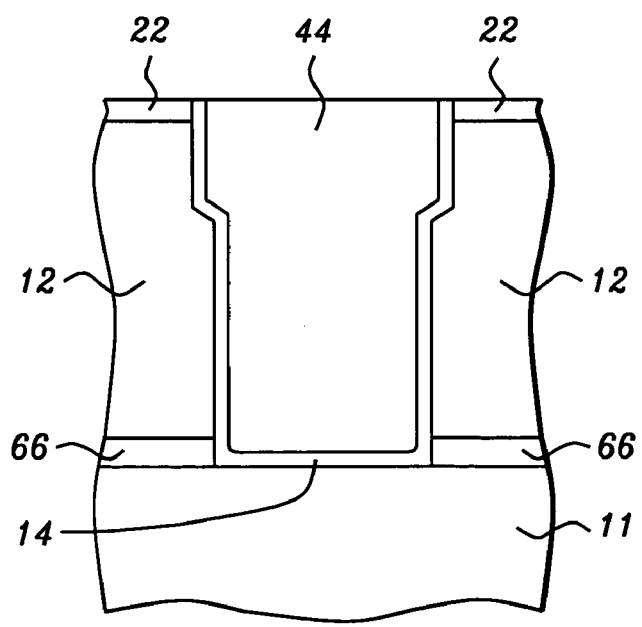

Then, as seen in FIG. 9, CMP is used to remove the excess copper with material removal continuing until USG layer 22 is reached. Note that, in addition to acting as a sink for fluoride ions coming out of the FSG layer, USG layer 22 is also being used as an optically based end-point detector since layer 14 is highly reflective while layer 22 is transparent.

While the invention has been particularly shown and described with reference to the preferred embodiments thereof, it will be understood by those skilled in the art that various changes in form and details may be made without departing from the spirit and scope of the invention.

The invention claimed is:

1. A semiconductor device comprising:
   a layer of FSG disposed on a substrate;
   a layer of USG, having an upper surface, disposed on the layer of FSG; and
   a via hole having a barrier layer on walls thereof, wherein the barrier layer extends from the upper surface to the substrate, and wherein the via hole is filled with a predetermined material.

2. The semiconductor device of claim 1 wherein the FSG layer is between about 0.4 and 1 microns thick and contains between about 3 and 10 atomic percent fluorine.

3. The semiconductor device of claim 1 wherein the USG layer is between about 0.1 and 0.2 microns thick.

4. A single damascene connector, comprising:
   a layer of FSG on a partially completed integrated circuit;
   a layer of USG, having a first upper surface, on the layer of FSG;
   a via hole extending from the first upper surface down to the integrated circuit;
   a barrier layer on all walls of the via hole; and
   the via hole being filled with copper having a second upper surface that is substantially flush with the first upper surface.

5. The single damascene connector of claim 4 wherein the barrier layer is selected from the group consisting of tantalum, tantalum nitride, titanium nitride, and titanium silicon nitride.

6. The single damascene connector of claim 4 wherein the barrier layer is between about 50 and 500 Angstroms thick.

7. A dual damascene connector, comprising:
   a layer of FSG on a partially completed integrated circuit;
   a layer of USG, having a first upper surface, on the layer of FSG;
   a trench, extending from the first upper surface through the USG layer a distance into the
   FSG layer, the trench having first sidewalls and a floor;
   a via hole, having second sidewalls, extending from the trench floor through the FSG layer down to the integrated circuit;
   a barrier layer on the first and second sidewalls and on the trench floor; and the via hole and trench being filled with copper and having a second upper surface substantially flush with the first upper surface.

8. The dual damascene connector of claim 7 wherein the trench has a width between about 0.1 and 1 microns and a depth between about 0.2 and 1 microns.

9. The dual damascene connector of claim 7 wherein the via hole has a width between about 0.1 and 0.6 microns and a depth between about 0.4 and 1 microns.

10. The dual damascene connector of claim 7 wherein the USG layer is between about 0.1 and 0.2 microns thick.

* * * * *